(12) United States Patent
Wiesemann

(10) Patent No.: US 10,088,500 B2
(45) Date of Patent: Oct. 2, 2018

(54) COMBINATION TEST DEVICE

(71) Applicant: Power Products, LLC, Menomonee Falls, WI (US)

(72) Inventor: David Lloyd Wiesemann, Pewaukee, WI (US)

(73) Assignee: Power Products, LLC, Menomonee Falls, WI (US)

( * ) Notice: Subject to any disclaimer, the term of this patent is extended or adjusted under 35 U.S.C. 154(b) by 25 days.

(21) Appl. No.: 15/147,696

(22) Filed: May 5, 2016

(65) Prior Publication Data

US 2016/0327599 A1    Nov. 10, 2016

Related U.S. Application Data

(60) Provisional application No. 62/157,231, filed on May 5, 2015.

(51) Int. Cl.
| | |
|---|---|
| *G01R 31/00* | (2006.01) |
| *G01R 1/04* | (2006.01) |
| *G01R 1/067* | (2006.01) |
| *G01R 19/155* | (2006.01) |
| *G01R 31/04* | (2006.01) |
| *G01R 31/07* | (2006.01) |

(52) U.S. Cl.
CPC ........... *G01R 1/04* (2013.01); *G01R 1/06788* (2013.01); *G01R 19/155* (2013.01); *G01R 31/041* (2013.01); *G01R 31/07* (2013.01)

(58) Field of Classification Search
CPC .... G01R 1/04; G01R 1/06788; G01R 19/155; G01R 31/041; G01R 31/07; G01R 1/07; G01R 1/071; G01R 15/12; G01R 15/125; G01R 19/15; G01R 19/2503; G01R 31/024; G01R 31/025; G01R 31/026; G01R 31/045

USPC ..... 324/67, 72.5, 133, 425.5, 508, 556, 662, 324/759, 114, 149, 156, 157, 555, 754.02, 324/754.27, 754.28, 754.29

See application file for complete search history.

(56) References Cited

U.S. PATENT DOCUMENTS

| | | | |
|---|---|---|---|
| 5,103,165 A | 4/1992 | Sirattz | |
| 5,518,411 A * | 5/1996 | Belleci | ............... H01R 13/4538 |
| | | | 439/140 |
| 5,642,052 A | 6/1997 | Earle | |
| 5,877,618 A | 3/1999 | Luebke et al. | |

(Continued)

OTHER PUBLICATIONS

Sperry Instruments, Single LED Indicator Stop Shock II GFCI Outlet Circuit Analyzer Tester, Detects Low Resistance.

(Continued)

*Primary Examiner* — Jeff Natalini
*Assistant Examiner* — Steven Yeninas
(74) *Attorney, Agent, or Firm* — Michael Best & Friedrich LLP

(57) ABSTRACT

A combination test device including detection circuitry, outlet tester circuitry, and a single housing. The detection circuitry is configured to wirelessly detect a voltage. The outlet tester circuitry electrically is configured to perform a plurality of electrical outlet testing functions. The single housing has a first end, a second end opposite the first end, and an enclosure between the first end and the second end. The enclosure encloses the detection circuitry positioned at the first end and encloses the outlet tester circuitry positioned at the second end.

19 Claims, 24 Drawing Sheets

(56) References Cited

U.S. PATENT DOCUMENTS

| | | | |
|---|---|---|---|
| 5,900,804 A | 5/1999 | Yewell | |
| 6,072,317 A | 6/2000 | Mackenzie | |
| 6,231,358 B1* | 5/2001 | Kerr, Jr. | H01R 24/66 439/140 |
| 6,724,589 B1 | 4/2004 | Funderburk | |
| 6,812,685 B2 | 11/2004 | Steber et al. | |
| 6,828,767 B2 | 12/2004 | Douglas | |
| 7,184,899 B2 | 2/2007 | Cruz | |
| 7,208,932 B1 | 4/2007 | Chun | |
| 7,259,567 B2 | 8/2007 | Sears et al. | |
| 7,633,282 B2 | 12/2009 | Radle et al. | |
| 7,944,212 B2 | 5/2011 | Radle et al. | |
| 7,994,795 B2 | 8/2011 | Drake et al. | |
| D661,605 S | 6/2012 | Laurino et al. | |
| 8,248,058 B2 | 8/2012 | Stair et al. | |
| 8,866,485 B1 | 10/2014 | Lacey et al. | |
| 9,116,178 B1 | 8/2015 | Czarnecki | |
| 2002/0057089 A1* | 5/2002 | Brown | G01R 31/041 324/508 |
| 2004/0174173 A1 | 9/2004 | Elms et al. | |
| 2006/0043959 A1 | 3/2006 | Cavoretto | |
| 2008/0042657 A1* | 2/2008 | Radle | G01R 31/045 324/508 |
| 2009/0045817 A1 | 2/2009 | Savicki, Jr. et al. | |
| 2009/0084572 A1* | 4/2009 | Smith | H01R 13/5213 174/67 |
| 2009/0189597 A1 | 7/2009 | Lagerberg et al. | |
| 2010/0039279 A1 | 2/2010 | Luebke et al. | |
| 2010/0097733 A1 | 4/2010 | E. | |
| 2014/0266287 A1 | 9/2014 | Reeder, III | |
| 2016/0064850 A1* | 3/2016 | Draper, Jr. | H01R 13/516 439/137 |

OTHER PUBLICATIONS

Sperry Instruments, DualCheck 2-in-1 Tester, 50-1000V AC Non-Contact Voltage Detector, GFCI Outlet Circuit Analyzer.

Office Action from the US Patent and Trademark Office for U.S. Appl. No. 15/147,688 dated Jul. 28, 2017 (12 pages).

* cited by examiner

COMBINATION TEST DEVICE

CROSS-REFERENCE TO RELATED APPLICATION

This application claims the benefit of U.S. Provisional Patent Application No. 62/157,231, filed on May 5, 2015, the entire content of which is hereby incorporated by reference.

FIELD

The present invention relates to an electrical test device.

BACKGROUND

Receptacle testers are used to verify the correct wiring of an electrical outlet. For example a wall outlet. A receptacle tester can be used to determine whether an outlet is functioning (i.e., would provide power and an appropriate voltage to an attached device for operation) and/or whether the wiring is safe (i.e., whether improper wiring could result in damage to the device or create a situation in which a person may receive an electrical shock).

Conventional receptacle testers have a body and a plug that extends from the body. The plug includes three prongs (one for hot contact, one for neutral contact, and one for ground contact). The conventional receptacle tester also has three indicators and a code label located on the body. Optionally, a ground fault circuit interrupter tester operated by a button may be available on the receptacle tester.

SUMMARY

When the plug of a conventional receptacle tester is plugged into a live outlet, one or more of the indicators may light up to indicate the wiring status of the outlet. A user then compares the on/off status of each of the three indicators to a code label, which has a list of the wiring states for each of the indicator combinations, to determine whether or not the outlet is correctly wired. If the outlet is not correctly wired, then comparison of the indicator to the code label can be used to determine which of the wires are incorrectly connected to the outlet.

Under certain conditions, it can be difficult for the user to read the code label. Because receptacle testers are generally quite small, the text printed on the code label must also be small and is often difficult to read. Further complicating reading of the code label is that, because at least the outlet being tested is not connected to a light source, it is likely that the receptacle tester is being used in a poorly lit area. Additionally, not all outlets are oriented in an upright position (i.e., two flat prongs on top, one ground prong on bottom). Upon insertion of the receptacle tester into an upside-down outlet, it may be difficult for the user to consult the code label or see the indicators.

In some applications, testing can be simplified through the initial use of a non-contact tester. The non-contact tester includes a conductive element that, when placed near an AC conductor, provides an indication if an AC voltage is impressed on the conductor. The non-contact tester, therefore, can be used to determine which of a number of conductors is carrying an AC voltage. In a typical testing situation, therefore, an initial test could be conducted to determine which of a number of AC conductors were "hot," and a receptacle tester could then be used to determine wiring conditions.

The non-contact testers are used to detect whether a voltage is present at the location or wire being probed. If there is a voltage present, the non-contact tester either lights and/or an alarm sounds off, repeatedly or continuously for as long as the probe tip is held in the vicinity of the voltage, to signal the operator that the voltage is present. Knowing the voltage is present, the operator will exercise caution around the location or handling the wire, or will turn the power to the wire off, for example, turning off a circuit breaker at a circuit breaker panel.

One embodiment provides a combination test device that includes detection circuitry, outlet tester circuitry, and a single housing. The detection circuitry is configured to wirelessly detect a voltage. The outlet tester circuitry is configured to perform a plurality of electrical outlet testing functions. The single housing has a first end, a second end opposite the first end, and an enclosure between the first end and the second end. The enclosure encloses the detection circuitry positioned at the first end and encloses the outlet tester circuitry positioned at the second end.

Other embodiments and aspects of the invention will become apparent by consideration of the detailed description and accompanying drawings.

DETAILED DESCRIPTION

Figure 1:
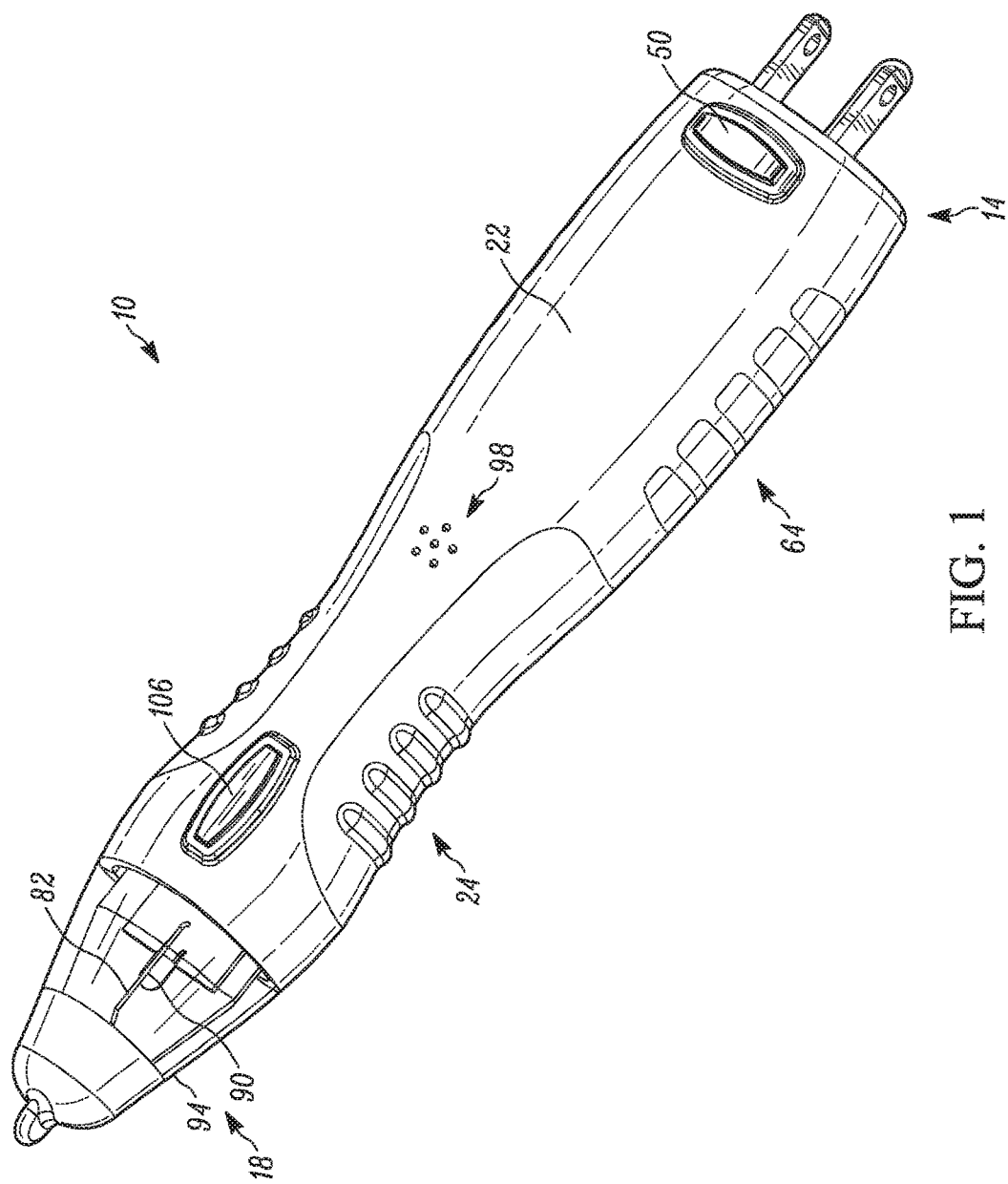
FIG. 1 is a perspective view of a combination test device.
Figure 2:
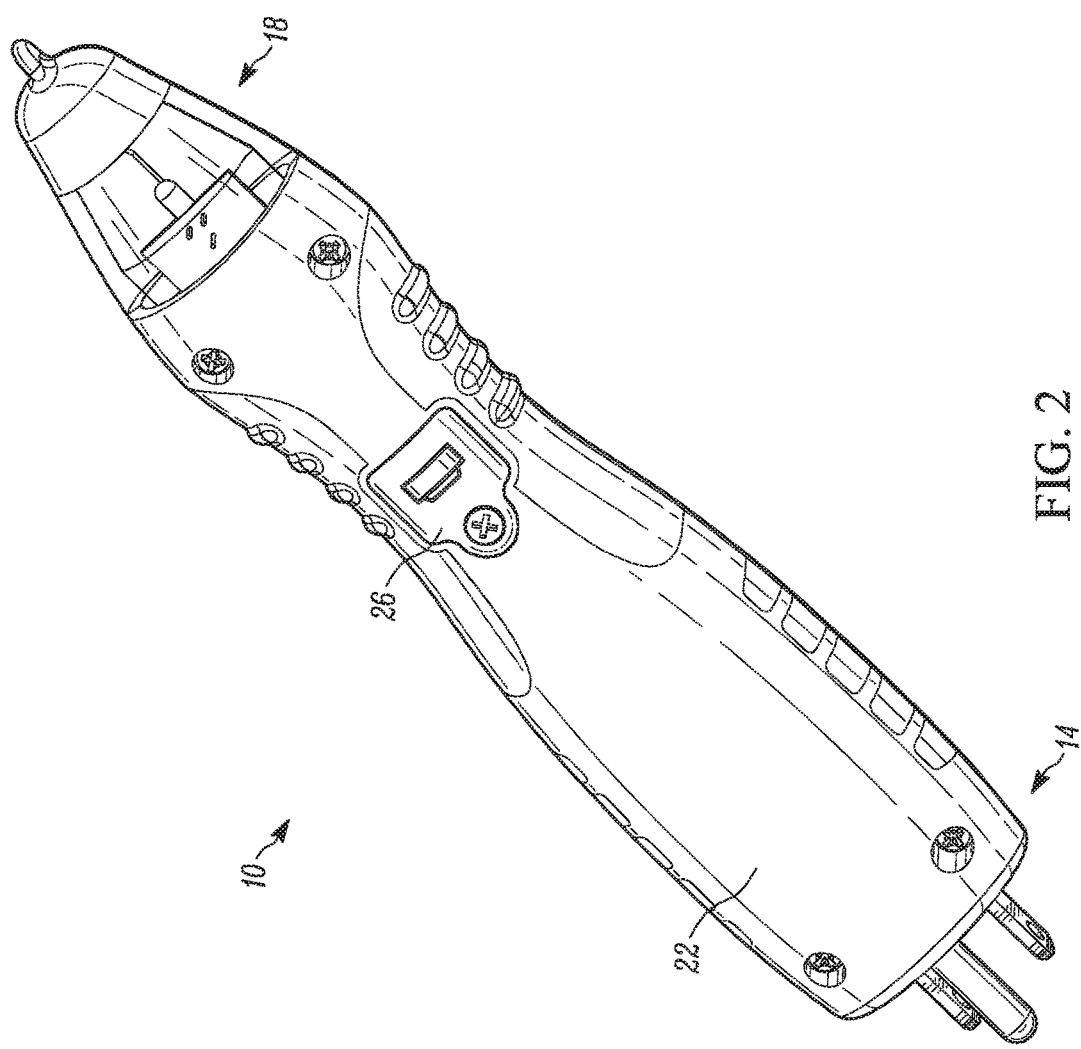
FIG. 2 is another perspective view of the device of FIG. 1.
Figure 3:
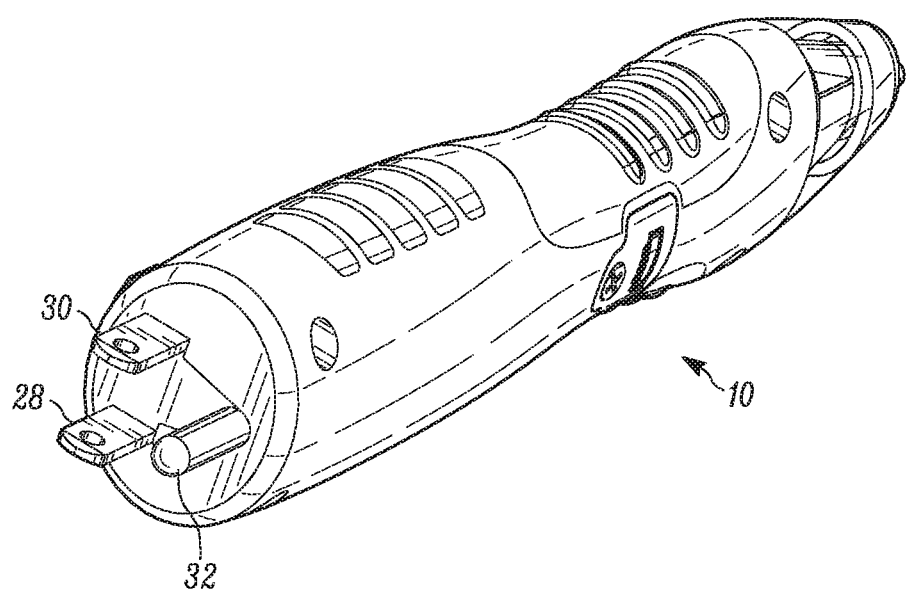
FIG. 3 is another perspective view of the device of FIG. 1.
Figure 4:
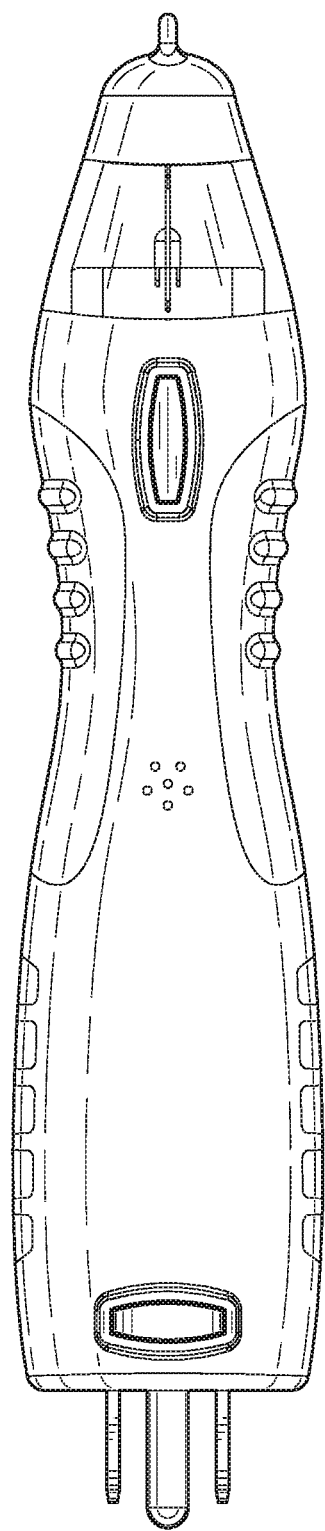
FIG. 4 is a top view of the device of FIG. 1.
Figure 5:
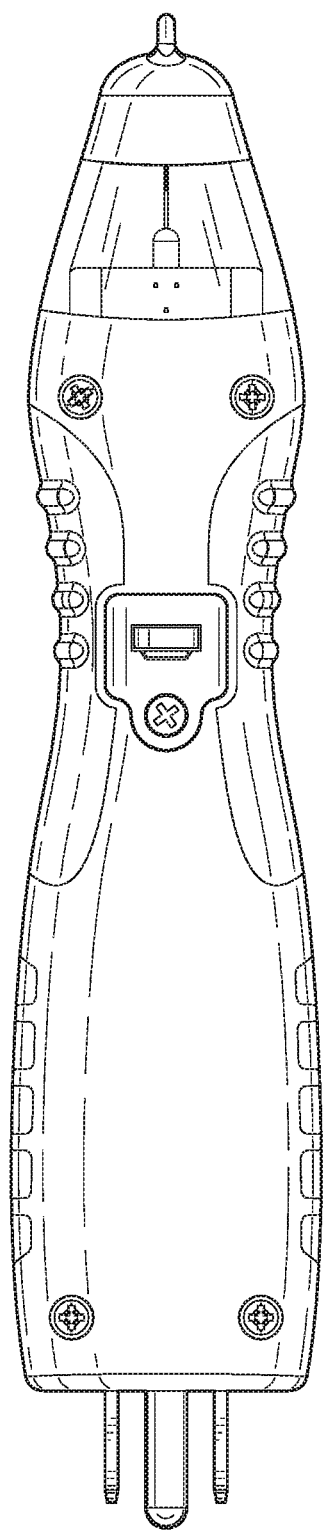
FIG. 5 is a bottom view of the device of FIG. 1.
Figure 6:
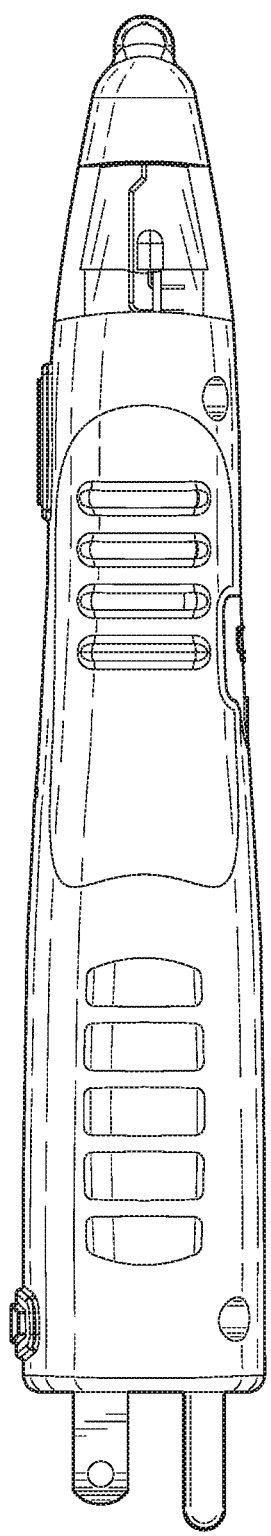
FIG. 6 is a side view of the device of FIG. 1.
Figure 7:
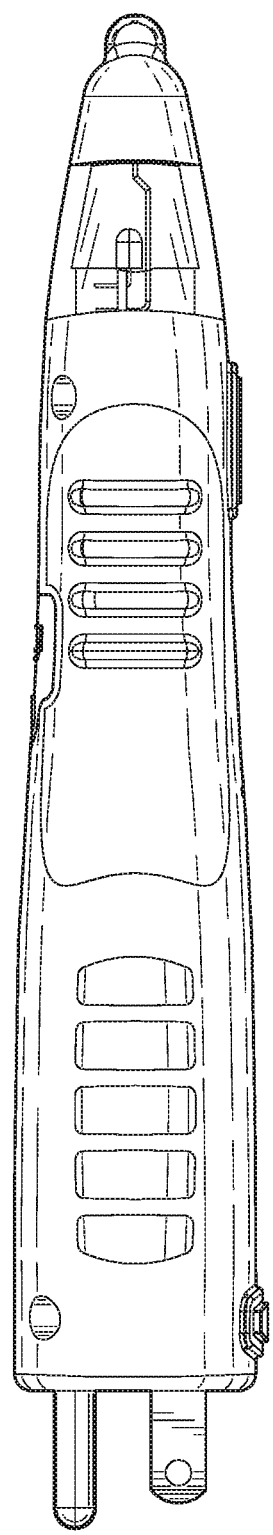
FIG. 7 is an opposite side view of the device of FIG. 1.
Figure 8:
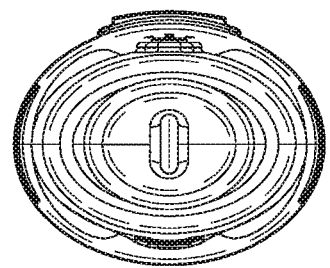
FIG. 8 is an end view of the device of FIG. 1.
Figure 9:
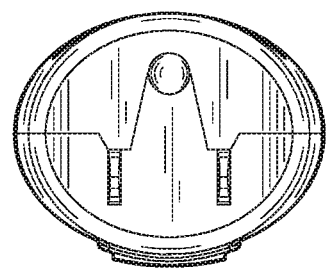
FIG. 9 is an opposite end view of the device of FIG. 1.
Figure 10:
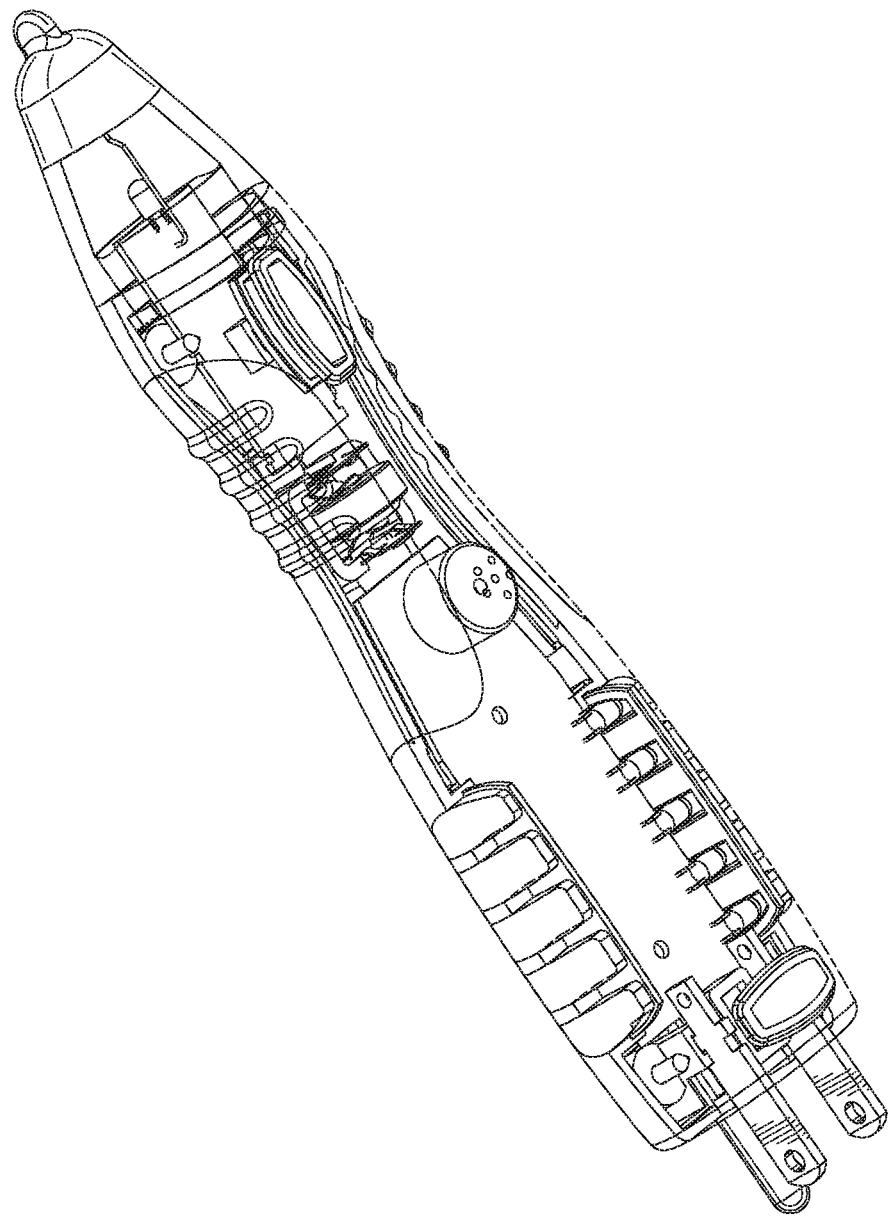
FIG. 10 is a perspective view of the device of FIG. 1 with a portion of the housing illustrated as being transparent.
Figure 11:
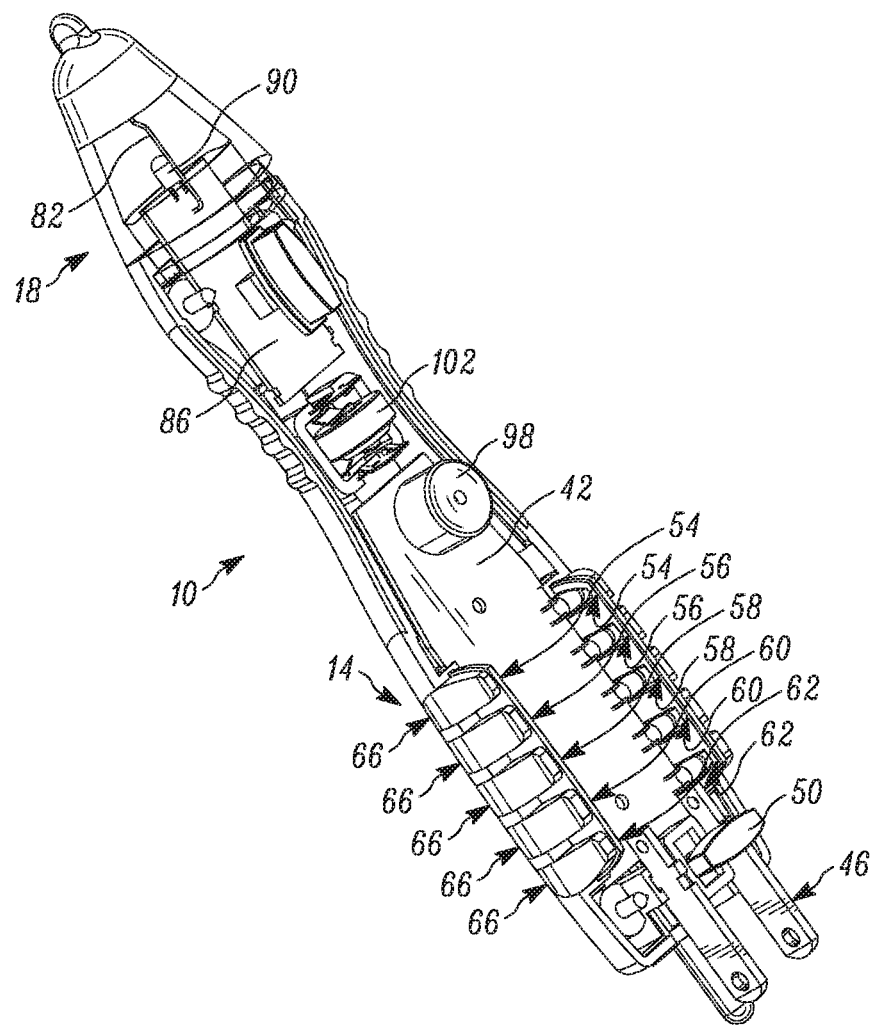
FIG. 11 is a top perspective view of the device of FIG. 1 with the portion of the housing removed.
Figure 12:
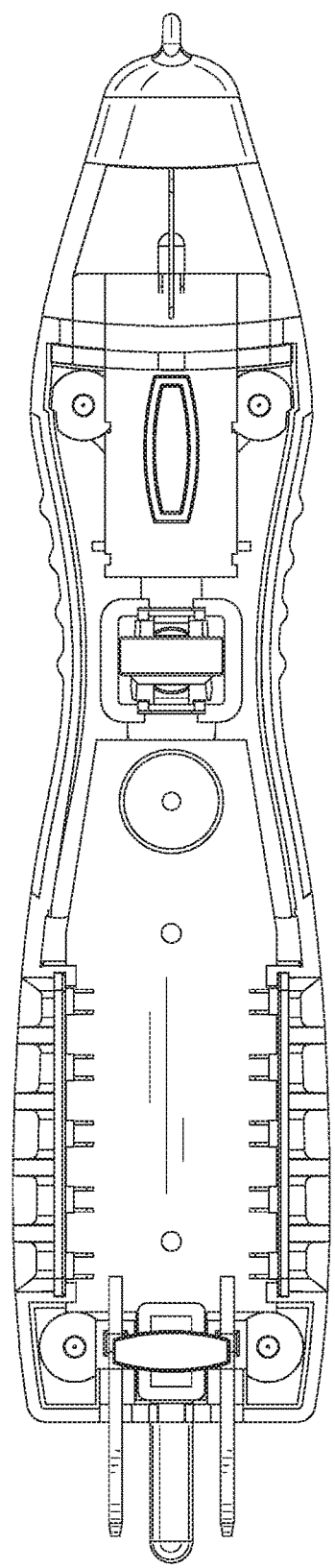
FIG. 12 is a top view of the tester with the housing portion removed as shown in FIG. 11.
Figure 13:
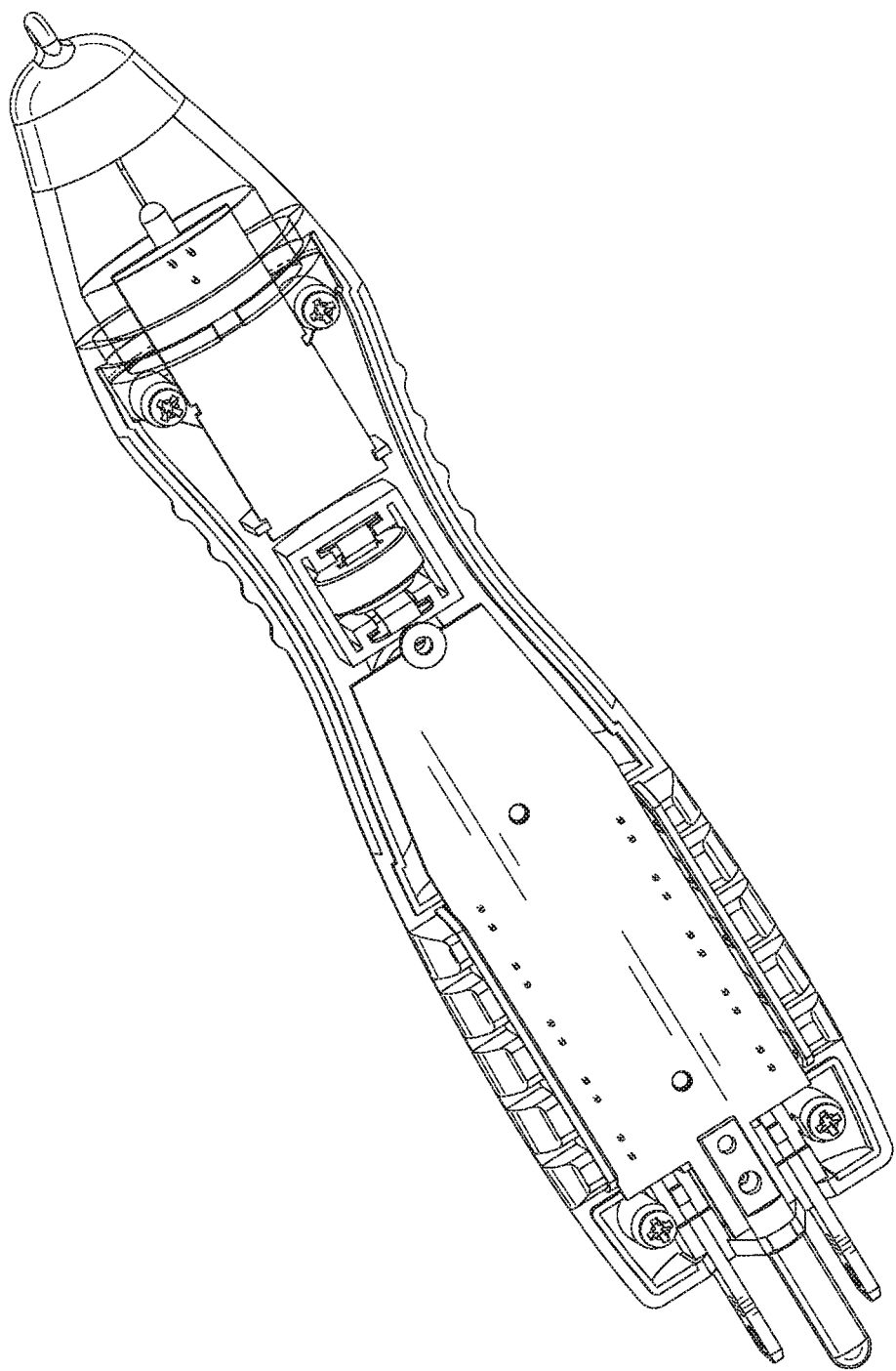
FIG. 13 is a bottom perspective view of the device of FIG. 1 with a portion of the housing removed.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Also, it is to be understood that the phraseology and terminology used herein is for the purpose of description and should not be regarded as limiting. Use of "including" and "comprising" and variations thereof as used herein is meant to encompass the items listed thereafter and equivalents thereof as well as additional items. Use of "consisting of" and variations thereof as used herein is meant to encompass only the items listed thereafter and equivalents thereof.

FIGS. 1-19 illustrate a test device, such as a device 10 including a combination of, for example, a receptacle tester 14 and a non-contact voltage (NCV) tester 18. The device 10 includes a housing 22 supporting the testers 14, 18. In the illustrated construction, one tester (e.g., the receptacle tester 14) is positioned proximate one end of the housing 22, and the other tester (e.g., the NCV tester 18) is positioned proximate an opposite end of the housing 22. In the illustrated construction, the testers 14, 18 are electrically isolated (e.g., circuitry for each tester 14, 18 is not electrically connected to the other).

The housing 22 includes (see FIGS. 1-7, 14-16 and 18-19) a grip area 24 suitable for engagement by a user's hand. The grip area 24 is contoured and/or covered by material (e.g., elastomeric material, such as rubber, thermoplastic elastomers (TPE), Santoprene®, etc.) to facilitate gripping of the device 10. The housing 22 defines (see FIGS. 5, 13, 16 and 19) a compartment 26 for a power source (e.g., a battery).

The illustrated receptacle tester 14 is a GFCI receptacle tester for a 110-125 VAC standard residential electrical outlet in the United States, although independent aspects of the invention may be incorporated in a GFCI receptacle tester or a receptacle tester that is not capable of testing a GFCI. The tester 14 has (see FIGS. 1-8 and 10-19) a standard plug with two flat blades 28 and 30 and a round prong 32 projecting from an end of the housing 22. One of the two flat blades 28, 30 is hot, the other is neutral, and the round prong 32 is ground. The round prong 32 is connected to the neutral one of the blades 28 and 30 back at the electrical service box of the building, where all of the electrical circuits of the building come together and are connected to the line voltage coming from the power company through circuit breakers of fuses.

In some constructions (not shown), when the tester 14 is not in use, the contacts 28-32 may be covered. For example, a cover (not shown) may be provided to cover the contacts 28-32. The cover may be movable (e.g., removable) between a covering position, in which the contacts 28-32 are covered, and a "use" position, in which the contacts 28-32 or uncovered for use. In other constructions (not shown), the contacts 28-32 themselves may be adjustable (e.g., movable, pivotable, etc.) between the covering position and the "use" position.

As shown in FIGS. 10-13 and 17, the tester 14 includes a printed circuit board (PCB) 42 electrically connected to the receptacle contacts 28-32 and, in the illustrated construction, a GCFI test circuit 46 including a switch 50. The GFCI test function is provided to test outlets wired in parallel to GFCI circuits (e.g., outlets for use in bathrooms, kitchens, outdoors, etc. which may require GFCI protection).

Figure 22:
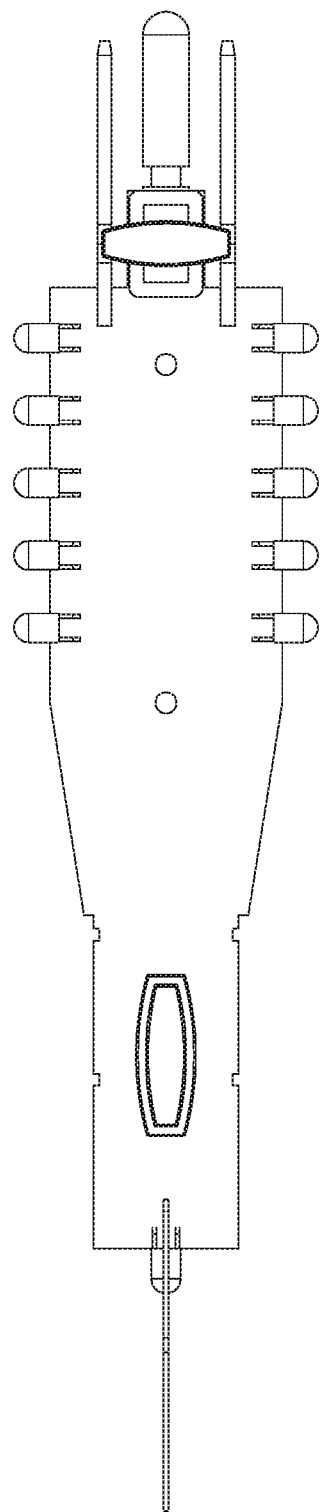
Figure 23:
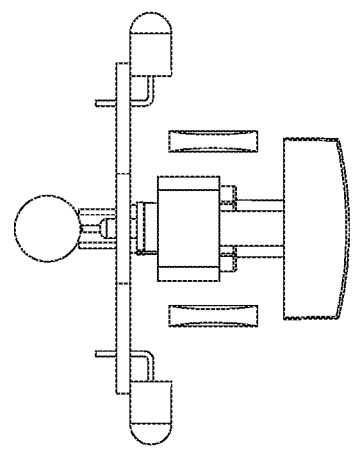

A number of indicators (e.g., pairs of light-emitting diodes (LEDs) 54, 56, 58, 60, 62) are electrically connected to the PCB 42. As explained below, each pair of LEDs 54-62 provides an indication of an associated wiring condition of a tested outlet (not shown). In the illustrated construction (see FIGS. 12 and 22), one of each pair of LEDs is provided on each lateral side of the device 10.

In an indicator section 64 of the housing 22, a lens 66 is provided for each LED 54-62. The lenses 66 facilitate visibility of the LEDs 54-62 from multiple sides of the device 10. In the illustrated construction, the LEDs 54-62 on each lateral side of the device 10 are visible from three sides (e.g., the top, the bottom and one side) of the device 10. Because each pair of LEDs 54-62 has one LED on each lateral side of the device 10, the LEDs 54-62 are visible from all sides (top, bottom and both opposite sides) of the device 10 to accommodate use of the device 10 to test outlets in any standard and non-standard orientations.

In another construction (not shown), a light pipe may be provided for each LED 54-62 that extends on either side of the LED 54-62 to the top and bottom sides of the device 10. The light pipes may be in two pieces and conduct the light to the two sides simultaneously, so that regardless of the orientation in which the outlet is installed, the light indicator will be visible from above the device 10.

In the illustrated construction, one pair of LEDs 54 is a first color (e.g., green) to clearly indicate a first condition ("CORRECT"), and other pairs of LEDs 56-62 are a different color (e.g., red) to clearly indicate a different condition (e.g., an error condition). In other constructions (not shown), in addition or as an alternative to colored LED pairs, one lens (not shown) may have a first color to indicate the first condition, and other lenses (not shown) may have a different color to indicate the different condition(s).

Figure 14:
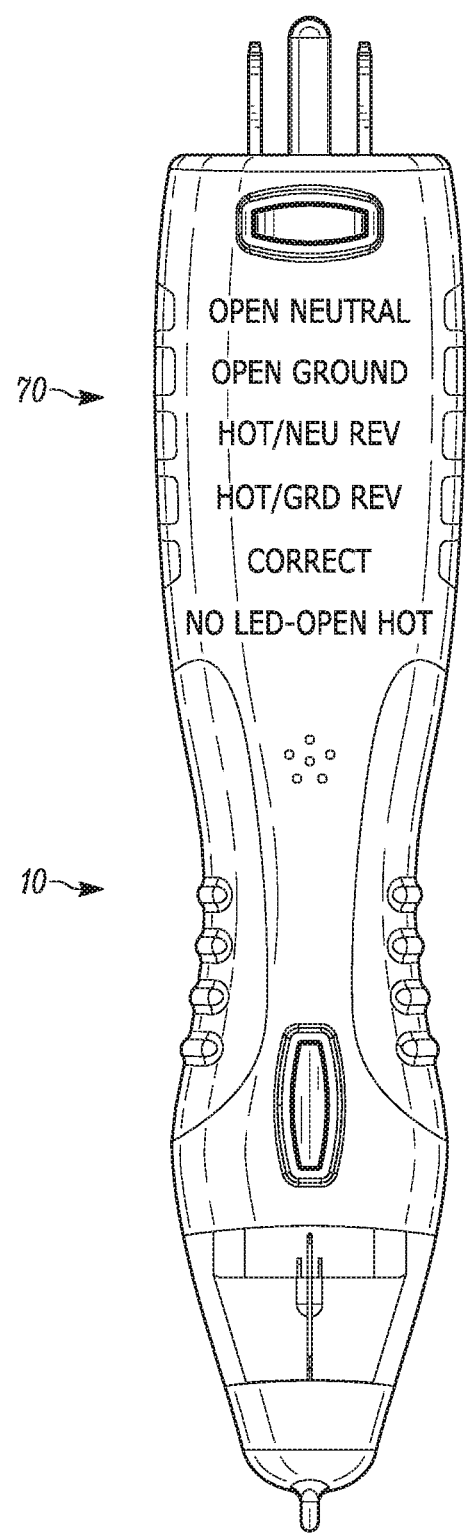
FIGS. 14-19 are views of a combination test device.
Figure 15:
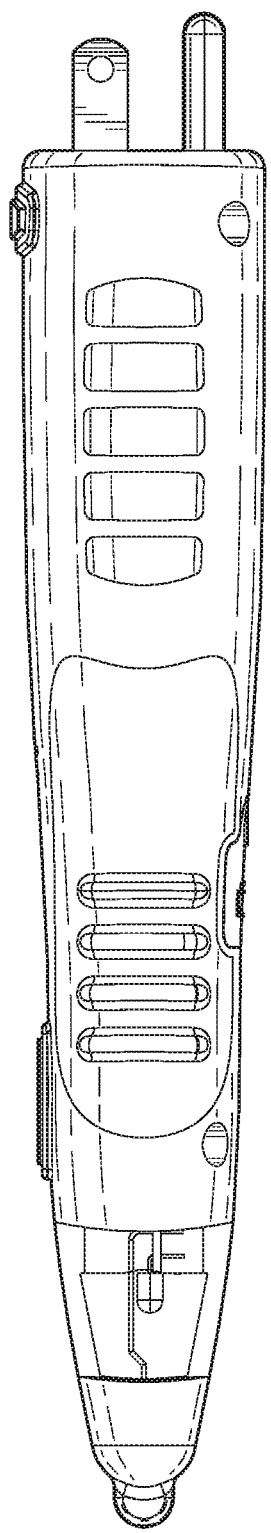
Figure 16:
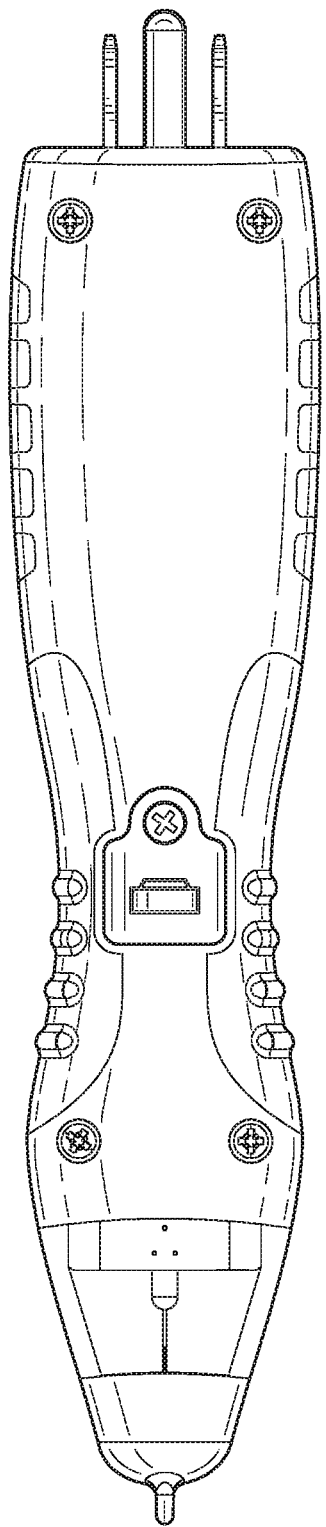
Figure 17:
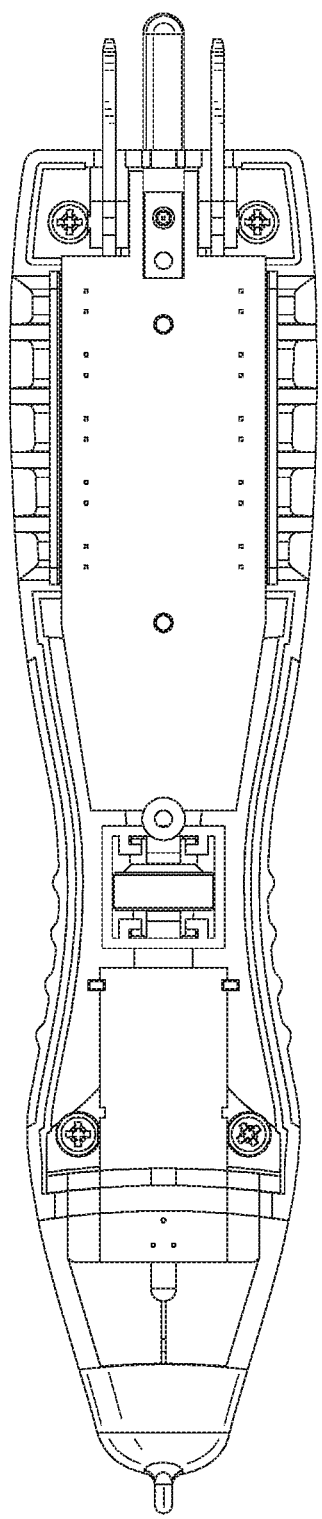
Figure 18:
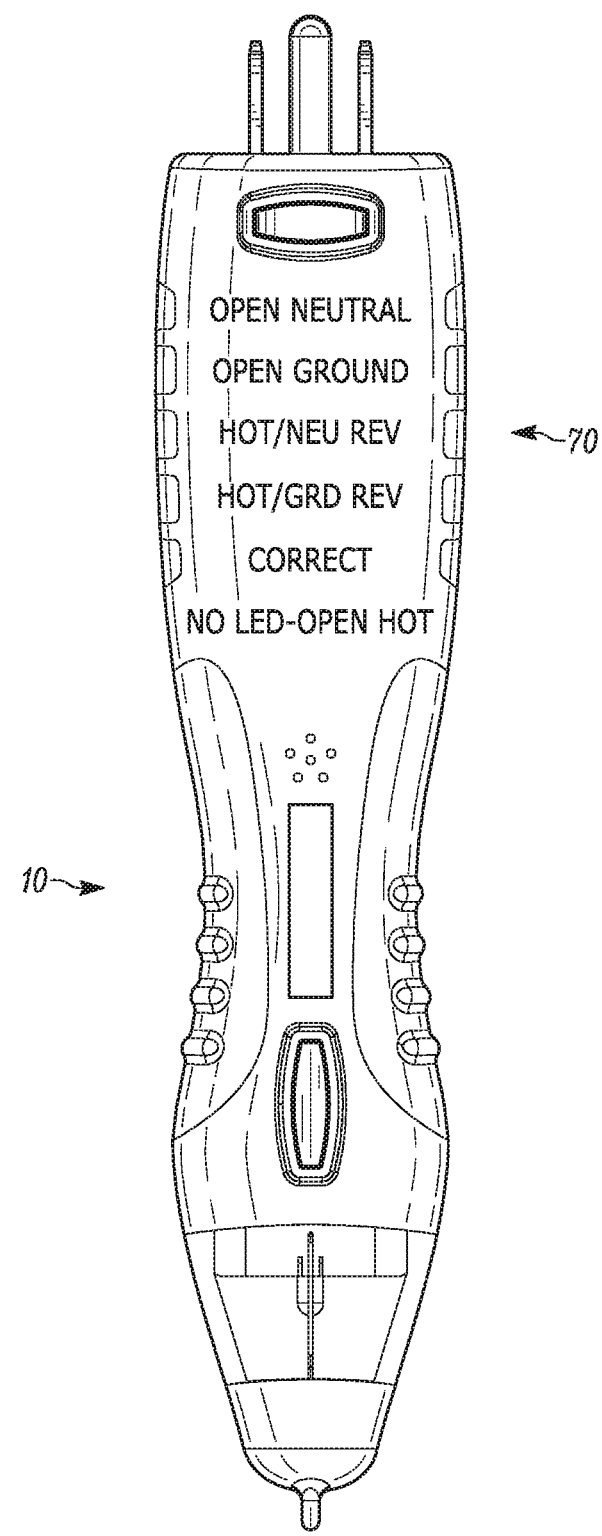
Figure 19:
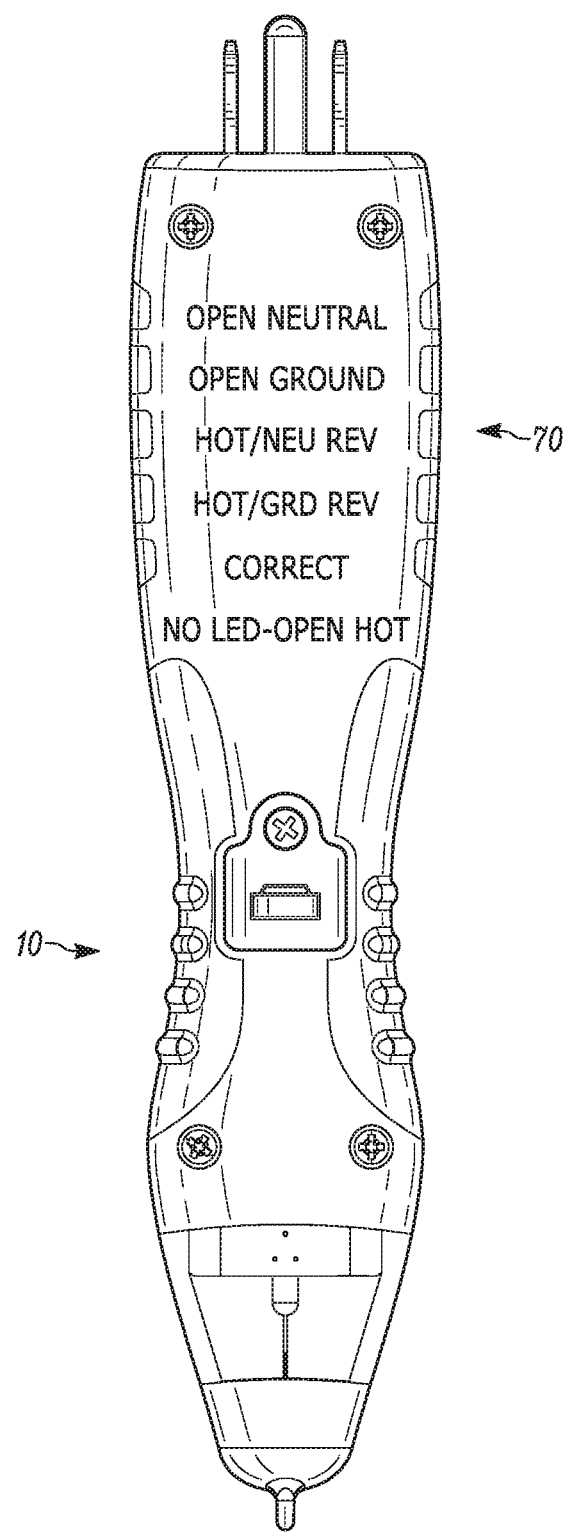
Figure 20:
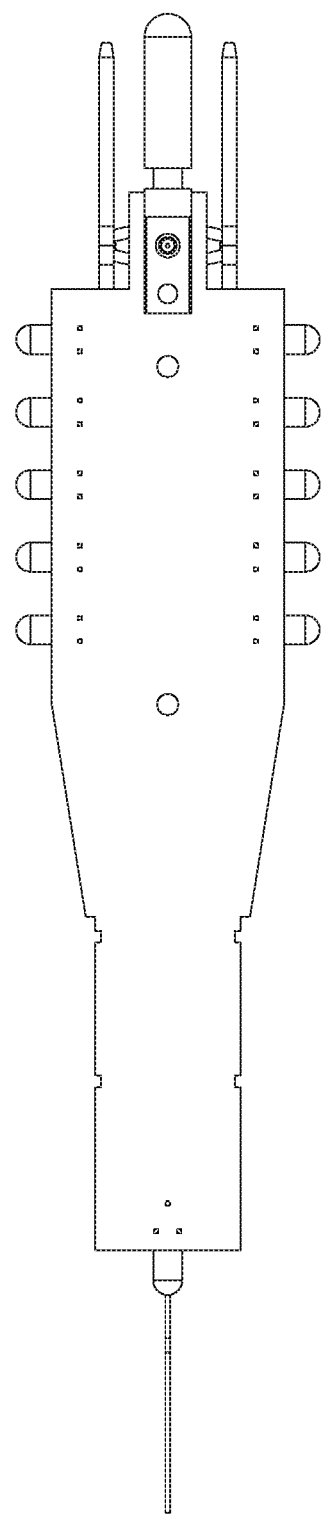
FIGS. 20-23 are views of a printed circuit board of a combination test device.
Figure 21:
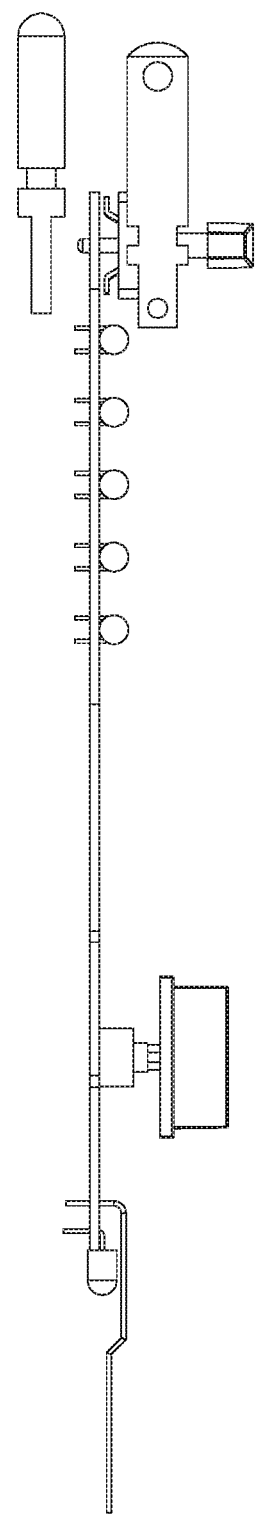

As shown in FIGS. 14 and 18-19, markings 70 are associated with the indicators (LEDs 54-62). In the illustrated construction, the markings 70 include characters (e.g., words, abbreviations, acronyms, etc.) representative of the associated circuit condition. In the illustrated construction, the markings 70 are provided on opposite large surfaces (e.g., top and bottom) of the device 10.

Figure 24:
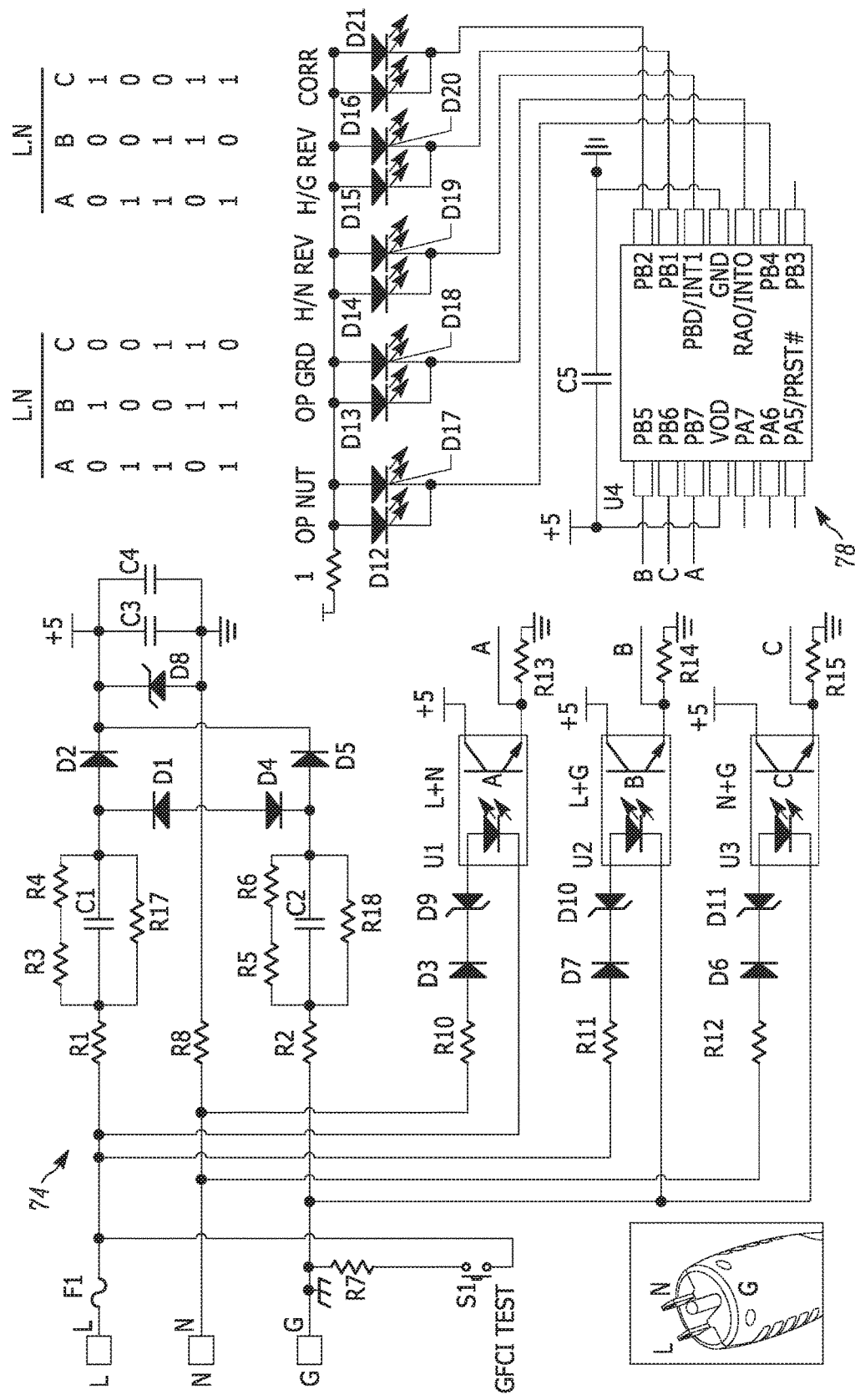
FIG. 24 is a schematic diagram of an electrical circuit of a test device.
Figure 25:
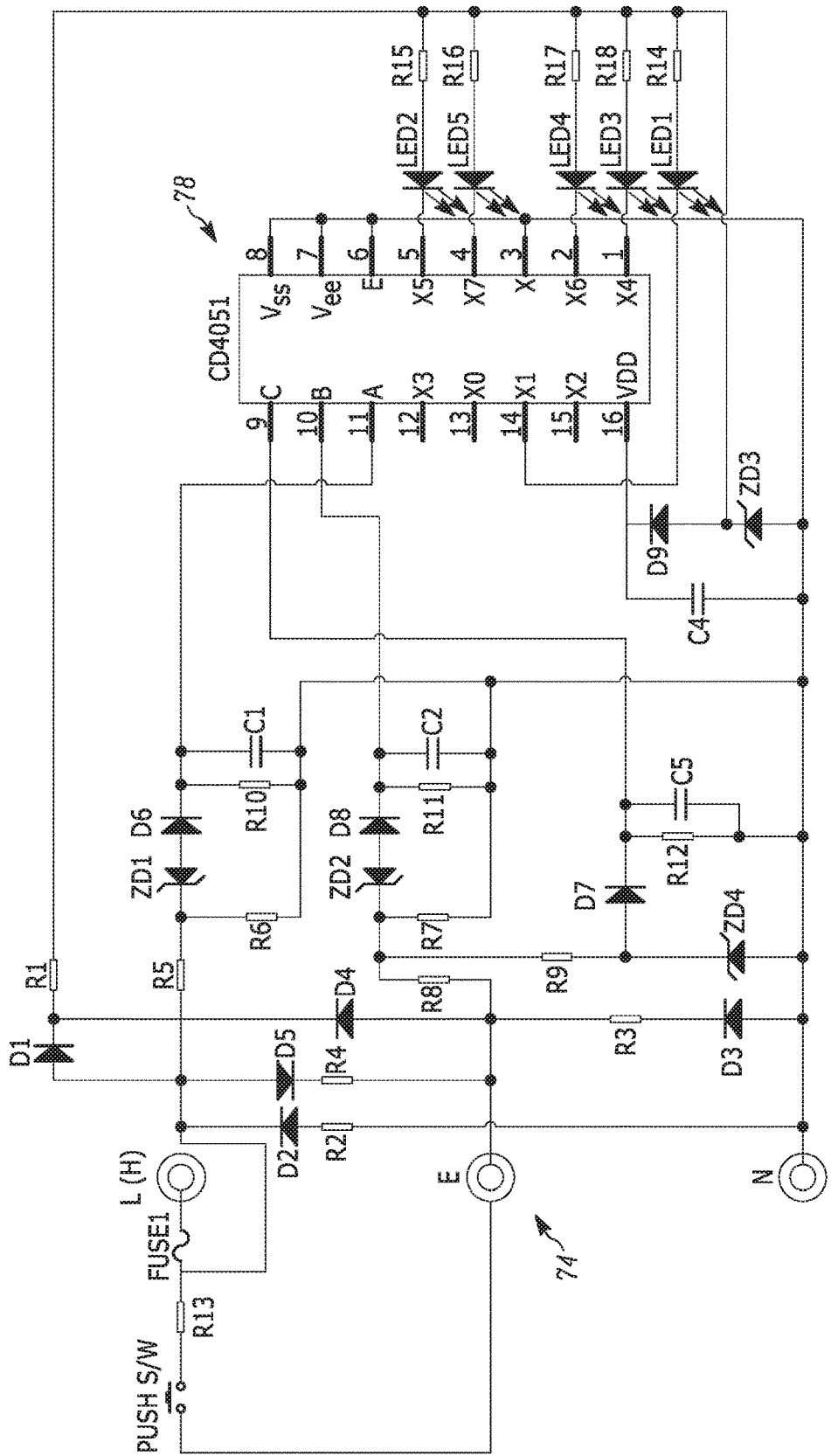
FIG. 25 is a schematic diagram of an alternative construction of an electrical circuit of a test device.
Figure 26:
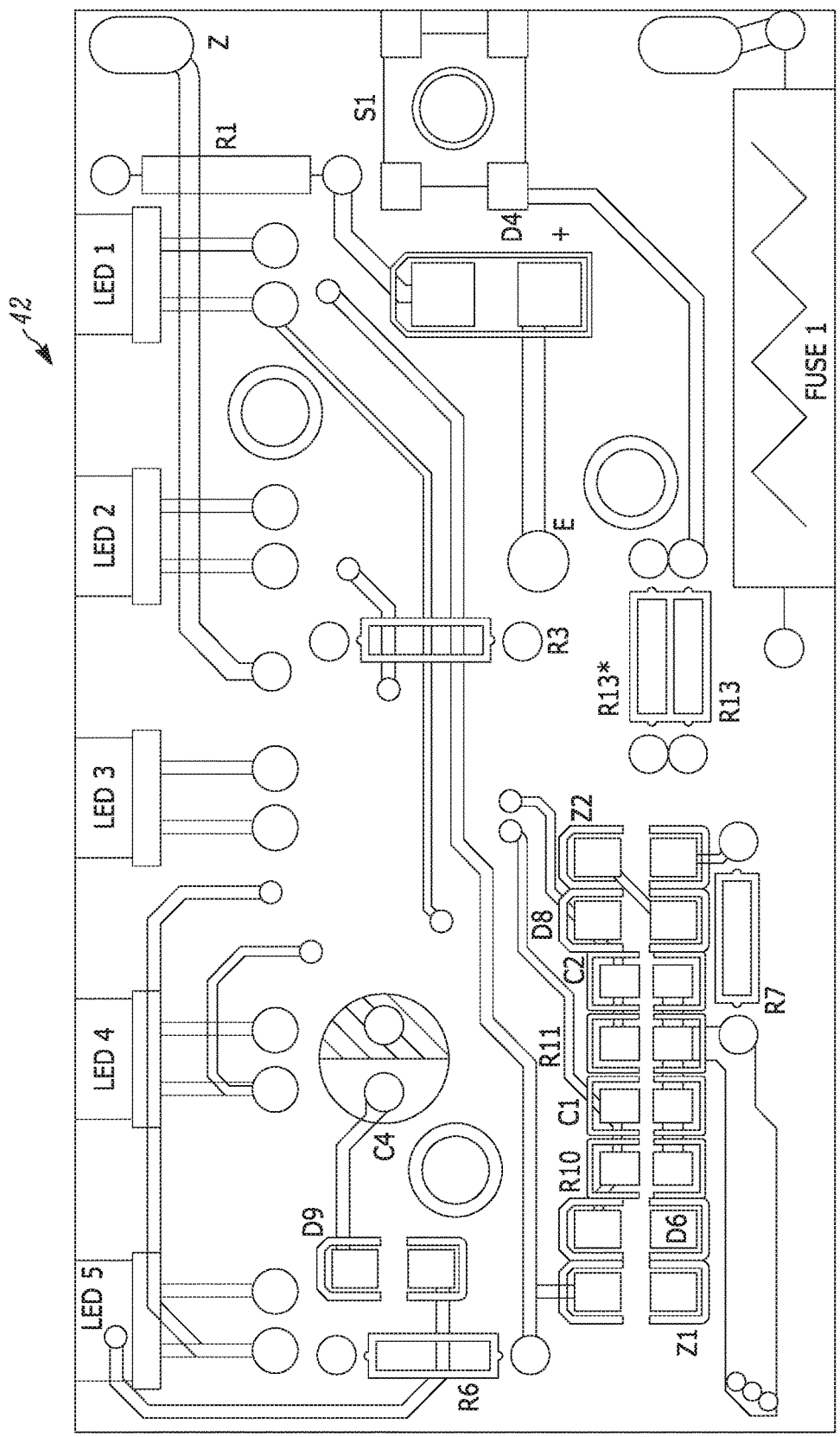
FIGS. 26-27 are schematic diagrams of an alternative construction of a printed circuit board of a test device.
Figure 27:
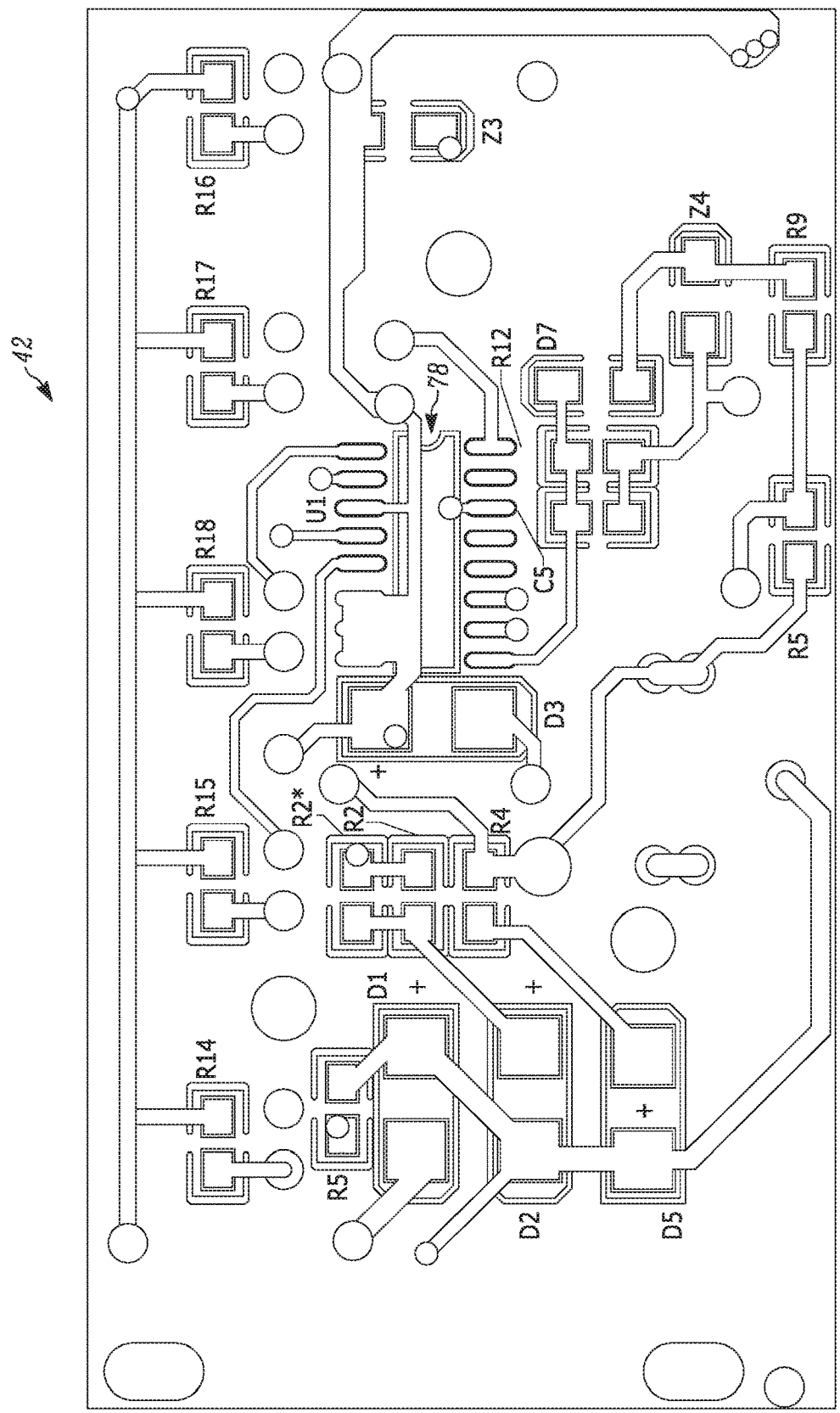

FIGS. 24-25 illustrate exemplary circuitry 74 of the tester 14. The illustrated outlet tester circuitry 74 includes an electronic controller 78 operable to execute a program to perform functionality such as, for example, analyze the circuit connection of the outlet to be tested, analyze the ground circuit, etc. It should be understood that other suitable circuits, components would also be acceptable.

The outlet tester circuitry 74 includes components to test the wiring of the outlet. The components communicate with the electronic controller 78, and the electronic controller 78 is operable to determine the condition of the outlet. The electronic controller 78 is operable to control the indicators (LEDs 54-62) to indicate the condition of the outlet to the user.

In the illustrated construction, power for the outlet tester circuitry 74 including the electronic controller 78 is provided by the outlet to be tested. A small current is applied in the outlet tester circuitry 74 to analyze the resistance of the ground circuit to determine a low resistance value (e.g., 10 ohms or less).

Unlike "neon bulb" receptacle testers, the tester 14 can detect low resistance values on the ground circuit. In addition, the tester 14 provides a single indicator (LED) readout without the need to read or memorize a chart to interpret multiple indicators. In other words, the single indicator (LED) readout of the tester 14 is "codeless," and the tester 14 is a codeless receptacle tester.

In the illustrated construction, there are six possible conditions of the 110-125 VAC electrical outlet into which the tester 14 is plugged. These exemplary conditions of the tester 14 are as follows: Correct, meaning that the ground, neutral and hot wires inside the outlet are connected to the correct terminals of the outlet (LED 54); Bad ground, meaning that continuity is lacking between the ground terminal of the outlet and the ground of the electrical service (LED 60); Open neutral, meaning that continuity is lacking between the neutral terminal of the outlet and the ground of the electrical service (LED 62); Hot/Grd rev, meaning that the hot and ground wires of the service are improperly connect to the ground and hot terminals of the outlet, respectively (LED 56); Hot/Neu rev, meaning that the hot and neutral wires of the service are improperly connected to the neutral and hot terminals of the outlet, respectively (LED 58); and No indicators (no LED lit), meaning that there is no power to the tester 14, indicating that the hot wire of the service is not connected properly to the outlet.

The tester 14 indicates each of these six conditions without relying on any code as in the prior art. Instead, there is a separate indicator (e.g., LEDs 54-62) for each of the first five conditions, and for the sixth—open hot—no indicator (e.g., no LED is lit) when the tester 14 is plugged into an outlet to indicate that condition. Accordingly, the tester 14 is a codeless receptacle tester.

The non-contact voltage tester 18 provides the capability of quickly and easily detecting the presence of an active conductor. The NCV tester 18 detects the general vicinity of an AC voltage (e.g., from 12 to 600 volts) and indicates its presence with visual (flashing) and/or audible (beeping) indicators without contacting wires. The NCV tester 18 is operable to test outlets, switches, circuit breaker panels, wiring, light fixtures, etc.

The NCV tester 18 includes a probe 82 (plastic covered conductive element) projecting from an end of the housing 22 opposite the receptacle tester 14. Detection circuitry (e.g., a printed circuit board (PCB)) 86 is electrically connected to the probe 82 and includes a circuit (not shown) with a controller (not shown) and one or more indicators (e.g., a LED 90 (visible through a window 94), an audio source/speaker 98, etc.). The detection circuitry 86 includes an electronic controller that is operable to, for example, evaluate a signal from the probe 82, determine whether a voltage is present, control the indicator(s) 90, 98 to notify the user of the voltage condition, etc.

A power source (e.g., a battery 102) is supported in the compartment 26 and is operable to energize the circuit (including the controller, indicator(s), etc.). An actuator 106 is operable to control operation of the NCV tester 18. When the actuator 106 is operated (e.g., depressed), the NCV tester 18 operates to determine whether a voltage is present.

Structure and circuitry of the non-contact voltage tester 18 may be similar to that described and illustrated in, for example, U.S. Pat. Nos. 7,208,932; 6,828,767; 6,812,685; 5,877,618; 5,103,165, the entire contents of all of which are hereby incorporated by reference.

The electronic controller 78 of the receptacle tester and the controller of the NCV tester 18 include combinations of hardware and software that are operable to, among other things, configure and control operation of the tester(s) 14, 18 and/or the device 10. The controller(s) include a processing unit (e.g., a microprocessor, a microcontroller, or another suitable programmable device), non-transitory computer-readable media, and an input/output interface. The processing unit, the media, and the input/output interface are connected by one or more control and/or data buses. The computer-readable media stores program instructions and data. The processing unit is configured to retrieve instructions from the media and execute the instructions to perform the control processes and methods described herein.

The input/output interface transmits data from the controller(s) to external systems, networks, and/or devices and receives data from external systems, networks, and/or devices. The input/output interface stores data received from external sources to the media and/or provides the data to the processing unit.

Many of the components and logical structures described are capable of being implemented in software executed by a microprocessor or a similar device or of being implemented in hardware using a variety of components including, for example, application specific integrated circuits ("ASICs"). Terms like "controller" may include or refer to both hardware and/or software. Capitalized terms conform to common practices and help correlate the description with the coding examples, equations, and/or drawings. However, no specific meaning is implied or should be inferred simply due to the use of capitalization. Thus, the claims should not be limited to the specific examples or terminology or to any specific hardware or software implementation or combination of software or hardware.

Thus, the invention may generally provide, among other things, an electrical test device including a housing supporting a first tester (a receptacle tester) proximate one end and a second tester (a non-contact voltage tester) proximate the other end. The invention may also provide an electrical test device including a controller and a number of indicators (e.g., light-emitting diodes (LEDs)) electrically connected to the controller, each indicator being representative of a condition of wiring of an outlet to be tested, each indicator being visible from at least two opposite sides of the housing.

Preferred embodiments of the invention have been described in considerable detail. Many modifications and variations to the preferred embodiments described will be apparent to a person of ordinary skill in the art. Therefore, the claims should not be limited to the embodiments described.

What is claimed is:

1. A combination test device comprising:
    detection circuitry configured to wirelessly detect a voltage;
    a male plug;
    outlet tester circuitry electrically coupled to the male plug, the outlet tester circuitry configured to test an electrical outlet by performing a plurality of electrical outlet testing functions on the electrical outlet with the male plug; and
    a single continuous housing having
        a first end,
        a second end opposite the first end, and
        an enclosure between the first end and the second end, wherein the enclosure encloses the detection circuitry positioned at the first end, and encloses the outlet tester circuitry positioned at the second end.

2. The combination test device of claim 1, further comprising a battery, wherein the enclosure encloses the battery, and wherein the battery is electrically connected to the detection circuitry.

3. The combination test device of claim 1, wherein the male plug includes two flat blades and a round prong.

4. The combination test device of claim 1, further comprising a cover that is removably attached to the male plug.

5. The combination test device of claim 1, further comprising a movable cover that is configured to move between a covering position and a use position, wherein the movable cover completely covers prongs of the male plug when the movable cover is in the covering position, and wherein the movable cover exposes the prongs of the male plug when the movable cover is in the use position.

6. The combination test device of claim 1, wherein the male plug is an adjustable male plug that is configured to move between a covering position and a use position with respect to the single continuous housing, wherein the single continuous housing completely covers prongs of the adjustable male plug when the adjustable male plug is in the covering position, and wherein the single continuous housing exposes the prongs of the adjustable male plug when the adjustable male plug is in the use position.

7. The combination test device of claim 6, further comprising one of a switch or a pushbutton that is configured to move the adjustable male plug between the covering position and the use position in response to a user input.

8. The combination test device of claim 1, wherein the outlet tester circuitry includes an electronic controller configured to test the electrical outlet by performing the plurality of electrical outlet testing functions, wherein the plurality of electrical outlet testing functions includes analyzing a circuit connection of the electrical outlet and analyzing a ground circuit of the electrical outlet.

9. The combination test device of claim 8, wherein the electronic controller is further configured to determine only one wiring condition from a plurality of wiring conditions of the electrical outlet based on the plurality of electrical outlet testing functions, and wherein the one wiring condition from the plurality of wiring conditions of the electrical outlet is one selected from a group consisting of:
   a correct wiring condition,
   a bad ground wiring condition,
   an open neutral wiring condition,
   a hot and ground reversed wiring condition,
   a hot and neutral reversed wiring condition, and
   a disconnected wiring condition.

10. The combination test device of claim 1, further comprising an indicator section having a plurality of indicators, wherein each indicator of the plurality of indicators provides an indication of only one associated wiring condition of the electrical outlet.

11. The combination test device of claim 10, wherein the each indicator of the plurality of indicators has a lens and a light source, wherein the lens is configured to transparently cover and mechanically protect the light source, and wherein the indicator section is configured to be visible from all sides of the single continuous housing.

12. The combination test device of claim 11, wherein the light source is two or more light-emitting diodes (LEDs), and wherein the lens is a light pipe.

13. The combination test device of claim 1, wherein the detection circuitry is further configured to control a transducer to generate an audible alarm in response to wirelessly detecting the voltage.

14. The combination test device of claim 1, wherein the detection circuitry is further configured to control an output device to generate a visual alarm in response to wirelessly detecting the voltage.

15. The combination test device of claim 14, wherein the output device is an indicator section having an indicator that is configured to provide the visual alarm in response to wirelessly detecting the voltage.

16. The combination test device of claim 15, wherein the indicator includes a lens and a light source, wherein the lens is configured to transparently cover and mechanically protect the light source, and wherein the indicator section is visible from all sides of the single continuous housing.

17. The combination test device of claim 1, wherein the voltage is an AC voltage between twelve volts (V) and six hundred volts (V).

18. The combination test device of claim 1, wherein the detection circuitry includes
   an electronic controller, and
   a conductive probe projecting away from the first end of the single continuous housing and electrically connected to the electronic controller,
   wherein, to wirelessly detect the voltage, the electronic controller is configured evaluate a signal from the conductive probe, determine whether the voltage is present, and control an indicator to notify a user that the voltage is present.

19. The combination test device of claim 18, further comprising an actuator that is configured actuate the electronic controller to evaluate the signal from the conductive probe in response to receiving an input from the user.

* * * * *